United States Patent
McGowan

(10) Patent No.: US 7,512,380 B2
(45) Date of Patent: Mar. 31, 2009

(54) APPARATUS AND METHODS FOR FINDING AND USING AVAILABLE TRANSMISSION FREQUENCIES

(75) Inventor: Steven B. McGowan, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 375 days.

(21) Appl. No.: 09/932,286

(22) Filed: Aug. 17, 2001

(65) Prior Publication Data

US 2003/0036357 A1 Feb. 20, 2003

(51) Int. Cl.
*H04B 1/00* (2006.01)
*H04B 7/00* (2006.01)
*H04Q 7/20* (2006.01)

(52) U.S. Cl. ............ 455/63.3; 455/41.2; 455/90.2; 455/509; 455/452.1

(58) Field of Classification Search ......... 455/501, 455/440, 556, 41.2, 456.1, 455, 457, 179.1, 455/3.06, 63.1, 63.3, 67.13, 90.2, 452.1, 455/509

See application file for complete search history.

(56) References Cited

U.S. PATENT DOCUMENTS

| | | | |
|---|---|---|---|
| 5,455,823 A * | 10/1995 | Noreen et al. | 370/312 |
| 5,913,163 A * | 6/1999 | Johansson | 455/426.1 |
| 5,936,572 A * | 8/1999 | Loomis et al. | 342/357.07 |
| 5,995,804 A * | 11/1999 | Rootsey et al. | 455/11.1 |
| 6,060,996 A * | 5/2000 | Kaiser et al. | 340/7.28 |
| 6,085,090 A * | 7/2000 | Yee et al. | 455/440 |
| 6,181,921 B1 * | 1/2001 | Konisi et al. | 455/186.2 |
| 6,212,359 B1 * | 4/2001 | Knox | 725/135 |
| 6,272,328 B1 * | 8/2001 | Nguyen et al. | 455/277.1 |
| 6,424,820 B1 * | 7/2002 | Burdick et al. | 455/41.1 |
| 6,484,029 B2 * | 11/2002 | Hughes et al. | 455/434 |
| 6,487,296 B1 * | 11/2002 | Allen et al. | 381/80 |
| 6,493,546 B2 * | 12/2002 | Patsiokas | 455/277.1 |
| 6,650,877 B1 * | 11/2003 | Tarbouriech et al. | 455/186.1 |
| 6,757,913 B2 * | 6/2004 | Knox | 725/153 |
| 6,829,475 B1 * | 12/2004 | Lee et al. | 455/419 |
| 6,842,609 B2 * | 1/2005 | Davis et al. | 455/161.3 |
| 6,937,732 B2 * | 8/2005 | Ohmura et al. | 381/86 |
| 7,062,223 B2 * | 6/2006 | Gerber et al. | 455/3.06 |
| 7,072,686 B1 * | 7/2006 | Schrager | 455/556.1 |
| 7,158,768 B2 * | 1/2007 | Woo et al. | 455/179.1 |
| 7,349,691 B2 * | 3/2008 | Karr et al. | 455/422.1 |

(Continued)

*Primary Examiner*—Fan Tsang
*Assistant Examiner*—Lisa Hashem
(74) *Attorney, Agent, or Firm*—Schwegman, Lundberg & Woessner, P.A.

(57) ABSTRACT

A low-power radio frequency (RF) transmitter includes circuitry for finding unused transmission frequencies on a frequency band, such as an FM broadcast band, and to use an available frequency to broadcast a low-power audio signal to a sound reproduction device. In one embodiment, the sound reproduction device forms part of an entertainment system such as a vehicular stereo, home stereo, boom box, or RF headset. In one embodiment, the transmitter is operatively part of a sound generation device capable of generating and/ or reproducing music or sound, such as an MP3 player or other portable entertainment device, personal digital assistant, electronic musical instrument, electronic toy, wireless microphone, or the like. The sound generation device can use an RF receiver or a geoposition source to identify an available transmission frequency. Also described are a sound generation system, a computer-readable medium, and various methods, including methods for finding and using available transmission frequencies.

8 Claims, 9 Drawing Sheets

U.S. PATENT DOCUMENTS

| | | | |
|---|---|---|---|
| 2001/0009570 A1* | 7/2001 | Knox | 375/259 |
| 2001/0049262 A1* | 12/2001 | Lehtonen | 455/41 |
| 2003/0040272 A1* | 2/2003 | Lelievre et al. | 455/3.06 |
| 2003/0060219 A1* | 3/2003 | Parsiokas | 455/501 |
| 2003/0068974 A1* | 4/2003 | Kanamaluru et al. | 455/3.06 |
| 2003/0153338 A1* | 8/2003 | Herz et al. | 455/517 |
| 2004/0067733 A1* | 4/2004 | Cook et al. | 455/3.01 |
| 2004/0209569 A1* | 10/2004 | Heinonen et al. | 455/41.2 |
| 2005/0113113 A1* | 5/2005 | Reed | 455/456.3 |
| 2006/0214837 A1* | 9/2006 | Liu et al. | 342/52 |
| 2006/0217137 A1* | 9/2006 | Kushalnagar et al. | 455/501 |
| 2007/0218841 A1* | 9/2007 | Wright | 455/63.3 |
| 2007/0264937 A1* | 11/2007 | Han et al. | 455/63.3 |
| 2008/0045175 A1* | 2/2008 | Yoon et al. | 455/188.1 |
| 2008/0214238 A1* | 9/2008 | Rokusek et al. | 455/557 |

* cited by examiner

APPARATUS AND METHODS FOR FINDING AND USING AVAILABLE TRANSMISSION FREQUENCIES

TECHNICAL FIELD

The inventive subject matter relates generally to the field of radio frequency (RF) technology and, more particularly, to apparatus and methods for finding and using available transmission frequencies.

BACKGROUND INFORMATION

Many different types of personal entertainment systems are known that provide sound reproduction and/or sound generation. These include CD (compact disk) players, mini-disk and micro-disk players, MP3 (Motion Picture Experts Group, Audio Layer 3) players, cassette tape players, AM (amplitude modulation)/FM (frequency modulation) radios, handheld and portable computers, PDAs (personal digital assistants), television and video playback equipment including DVDs (digital video disks), electronic musical instruments, electronic toys, wireless microphones, and other personal/portable devices that provide sound reproduction and/or sound generation.

Personal entertainment systems and devices typically are very compact, and they often lack any substantial mechanism for quality sound reproduction, such as a high fidelity amplifier, loudspeaker or headset, tonal adjustment (e.g., bass and treble controls), balance (left and right relative volume), fade (front and rear relative volume), and so forth.

For the reasons stated above, and for other reasons stated below which will become apparent to those skilled in the art upon reading and understanding the present specification, there is a significant need in the art for apparatus and methods to enable quality sound reproduction from personal/portable personal entertainment systems.

DETAILED DESCRIPTION

In the following detailed description of embodiments of the invention, reference is made to the accompanying drawings which form a part hereof, and in which is shown by way of illustration specific preferred embodiments in which the inventive subject matter may be practiced. These embodiments are described in sufficient detail to enable those skilled in the art to practice them, and it is to be understood that other embodiments may be utilized and that architectural, procedural, mechanical, and electrical changes may be made without departing from the spirit and scope of the inventive subject matter. Such embodiments of the inventive subject matter may be referred to, individually and/or collectively, herein by the term "invention" merely for convenience and without intending to voluntarily limit the scope of this application to any single invention or inventive concept if more than one is in fact disclosed. The following detailed description is, therefore, not to be taken in a limiting sense, and the scope of embodiments of the present invention is defined only by the appended claims.

The inventive subject matter provides a sound reproduction capability for relatively low-cost and/or lightweight personal entertainment systems. The inventive subject matter also provides methods for identifying and using available, non-interfering transmission channels or frequencies on a frequency band, such as an FM broadcast band. Various embodiments are illustrated and described herein. In one embodiment, a low-power FM transmitter forms part of a portable sound generation device that is capable of generating and/or reproducing music or sound, such as an MP3 player or other personal entertainment device, personal digital assistant, electronic musical instrument, electronic toy, wireless microphone, or the like.

In one embodiment, the music or sound is reproduced through a sound reproduction device that forms part of an entertainment system such as a vehicular entertainment system (e.g. a car stereo), a home entertainment system (e.g. a stereo system), or a portable entertainment system (e.g. a "boom box" or an RF headset).

In various embodiments, the sound generation device can use an RF receiver or a geoposition source (e.g. a cellular telephone, a GPS receiver, or manual entry of geoposition information such as a postal code) to identify an available transmission frequency. The inventive subject matter offers an inexpensive, straight-forward solution to reproducing audio source material residing on a portable sound generation device, thereby significantly increasing the versatility and commercial value of such devices.

Figure 1:
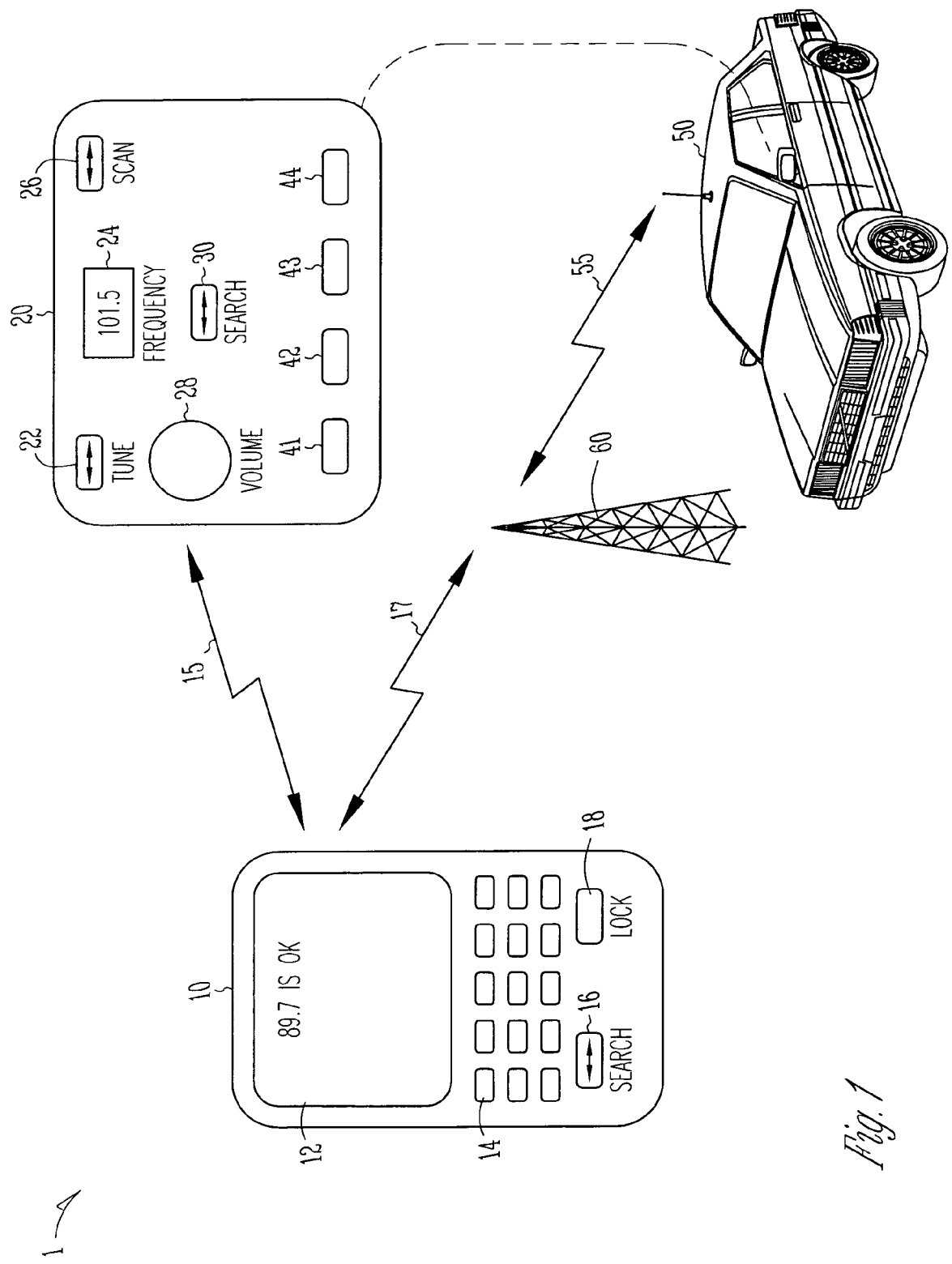
FIG. 1 is a diagram of an RF network that includes a mechanism to find and use available transmission frequencies, in accordance with one embodiment of the invention.

FIG. 1 is a diagram of an RF network 1 that includes a mechanism to find and use available transmission frequencies, in accordance with one embodiment of the invention. Portable sound generation device 10 is any device that is capable of generating and/or reproducing music or sound, such as a portable entertainment device or other type of portable electronic device.

Examples of a portable entertainment and/or portable electronic device include an MP3 player, a CD player, a mini-disk player, a micro-disk player, a DVD player, a cassette tape player, a radio, a cellular phone, a handheld computer, a portable computer, a television, a video player, an electronic musical instrument, an electronic toy, and a wireless microphone. However, the inventive subject matter is not to be construed as limited to the above-mentioned types of portable entertainment devices.

Sound generation device 10, in the example illustrated in FIG. 1, comprises a display 12, a plurality of user-operable buttons or keys 14, a SEARCH UP/DOWN button 16, and a LOCK button 18. The functions of SEARCH UP/DOWN button 16 and LOCK button 18 will be described below regarding the embodiment illustrated in FIG. 2.

Still referring to FIG. 1, sound generation device 10, among other functions, has a sound generation and/or sound reproduction function. Because of the compact size of sound generation device 10, it generally is lacking in one or more substantial mechanisms for quality sound reproduction, such as a high fidelity amplifier, loudspeaker or headset, tonal adjustment (e.g., bass and treble controls), balance (left and right relative volume), fade (front and rear relative volume), and so forth.

The inventive subject matter enables sound generation device 10 to generate and/or reproduce sound through a sound reproduction device 20 having inherent facilities or resources for superior sound reproduction. In the embodiment illustrated in FIG. 1, sound reproduction device 20 is a vehicular stereo system residing within vehicle 50. Sound reproduction device 20 includes a radio frequency (RF) receiver (not shown in FIG. 1, but illustrated in FIG. 7). The RF receiver of sound reproduction device 20 can not only receive RF signals 55 from a broadcast antenna 60, but it can also receive RF signals 15 from sound generation device 10 in the form of audio content to be reproduced by sound reproduction device 20. In one embodiment, the RF receiver of sound reproduction device 20 can also receive a channel selection signal from sound generation device 10 to instruct the RF receiver to tune to a particular unused transmission frequency to receive audio content via RF signals 15 from sound generation device 10.

In one embodiment, sound generation device 10 comprises an RF receiver (not shown in FIG. 1, but illustrated in FIG. 2) to receive RF signals 17 from broadcast antenna 60. Sound generation device 10 includes circuitry to locate and select an unused transmission frequency in the coverage area of broadcast antenna 60, and sound generation device 10 subsequently transmits audio content via non-interfering RF signals 17 to sound reproduction device 20.

In the embodiment illustrated in FIG. 1, sound reproduction device 20 is represented by a face plate or control panel that includes an UP/DOWN TUNE control 22, a FREQUENCY display 24, an UP/DOWN SCAN control 26, a VOLUME control 28, an UP/DOWN SEARCH control 30, and a plurality of station preset buttons 41-44. The control panel illustrated in FIG. 1 is merely one example of a control panel of a sound reproduction device 20, and it can assume many other forms, having more or fewer control functions and displays.

The UP/DOWN TUNE control 22, FREQUENCY display 24, UP/DOWN SCAN control 26, VOLUME control 28, and station preset buttons 41-44 are all well known on vehicular radios and other types of radios. In one embodiment, one or more of the station preset buttons 41-44 could be used to select an available transmission frequency within a particular geographical area. For example, a first preset button 41 could be used in Portland, Oreg., and a second preset button 42 could be used in Santa Clara, Calif. The function and operation of UP/DOWN SEARCH control 30 is explained below regarding FIG. 2.

Figure 2:
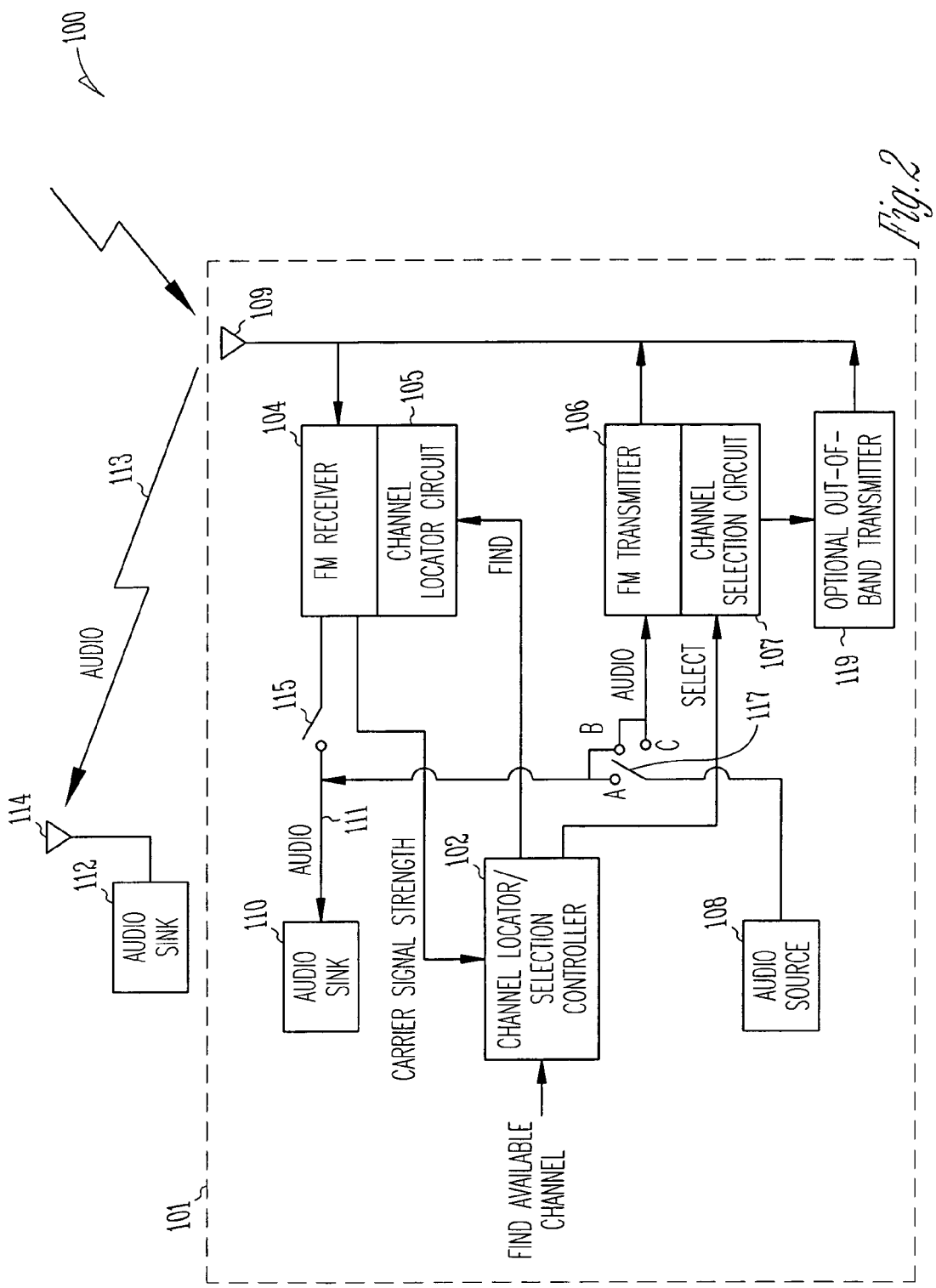
FIG. 2 is a block diagram of an RF network, including a portion of a sound generation device having circuitry to find and use available transmission frequencies, in accordance with one embodiment of the invention.

FIG. 2 is a block diagram of an RF network 100, including a portion of a sound generation device 101 having circuitry to find and use available transmission frequencies, in accordance with one embodiment of the invention. Sound generation device 101 comprises an audio source 108, which can be of any type, such as the output of an MP3 player, CD player, mini-disk player, micro-disk player, DVD player, cassette tape player, radio (AM, FM, or other modulation scheme), cellular phone, handheld computer, portable computer, television, video player, electronic musical instrument, electronic toy, wireless microphone, any combination of the above, or any other type of audio source.

Audio source 108 generates an audio signal to FM transmitter 106, which outputs a corresponding audio signal 113 from antenna 109 to antenna 114 of audio sink 112. Audio sink 112 can be any type of sound reproduction device, such as sound reproduction device 20 discussed above regarding FIG. 1.

If audio sink 112 is temporarily unavailable, or if the user of sound generation device 101 does not wish to use audio sink 112 for some reason, or if both audio sink 110 and audio sink 112 are desired to operate simultaneously, the audio output of audio source 108 and/or of FM receiver 104 can optionally be coupled via line 111 to internal audio sink 110 by appropriate settings of a suitable set of switches, such as two-position switch 115 and/or three-position switch 117. Audio sink 110 could be as simple as a headset, or it could include a basic amplifier and compact speaker.

FM transmitter 106 transmits an RF carrier signal 113 from antenna 109. The RF carrier signal 113 is modulated with the audio signal from audio source 108. RF carrier signal 113 has a specific carrier frequency. In order that this carrier frequency does not interfere with broadcast carrier frequencies currently in use in the broadcast area of antenna 60 (FIG. 1), it is necessary to locate and select at least one available carrier frequency.

In one embodiment, the first available carrier frequency is used. In another embodiment, several available carrier frequencies are identified and evaluated, and an optimum available carrier frequency is selected. For example, two or more bands of available carrier frequencies may be located. The sound generation device 101 evaluates these bands according to an algorithm and selects an optimum available frequency. One possible algorithm can be simply to use the center frequency of the first band having at least a predetermined frequency width. Another possible algorithm is to select a frequency at or near the center of the widest available band. Other algorithms can be used.

Channel locator/selection controller 102, in one embodiment, controls the operation of sound generation device 101 in locating and selecting an available carrier frequency. Channel locator/selection controller 102 is implemented with a stored program digital computer in one embodiment; however, it can be implemented with any other suitable circuitry, including an application specific integrated circuit (ASIC).

In response to a command to find an available channel (e.g. from the user's pressing either the UP or DOWN side of SEARCH button 16, FIG. 1), channel locator/selection controller 102 generates a "find" command to channel locator circuit 105 associated with FM receiver 104. Channel locator circuit 105, in turn, initiates a channel location function, supervised by channel locator/selection controller 102, that looks for and marks unused carrier frequencies, and that ultimately identifies an optimum available frequency. This process is explained in greater detail below regarding FIG. 3.

In one embodiment, RF receiver 104 generates a "carrier signal strength" signal to channel locator/selection controller 102. The "carrier signal strength" signal can be indicative of the signal strength of a particular frequency being received by RF receiver 104. Channel locator/selection controller 102 looks for any carrier frequencies having a signal strength below a predetermined minimum signal strength, and it marks them as available. It can also mark as unavailable any carrier frequencies having a signal strength at or above the predetermined minimum signal strength.

In one embodiment, when channel locator/selection controller 102 has identified an optimum available frequency, it generates a "select" signal to channel selection circuit 107 of FM transmitter 106. The "select" signal conveys the optimum available frequency to FM transmitter 106, whereupon FM transmitter 106 either begins transmission over antenna 109 at that frequency (if it has been idle), or FM transmitter 106 switches to that frequency (if it has previously been transmitting at a different frequency).

In another embodiment of the invention, channel locator/selection controller 102 displays an available frequency on display 12 (FIG. 1) of sound generation device 10 (FIG. 1), and the user can then push LOCK button 18 to select the displayed frequency as the available transmission frequency.

Concurrently, in one embodiment the user can manually change the receive frequency of audio sink 112 to match the selected transmission frequency of the sound generation device 101.

In another embodiment, to be discussed below, audio sink 112 can receive a channel selection signal from sound generation device 101, enabling it to automatically switch to the new transmission frequency of sound generation device 101. This can be carried out, for example, by transmitting a channel selection signal by an optional out-of-band transmitter 119. Out-of-band transmitter 119, which in one embodiment can transmit under the Bluetooth protocol, is coupled to channel selection circuit 107, and it transmits a channel selection signal, comprising the optimum available frequency, via antenna 109, through radio link 113, to antenna 114 of audio sink 112. Bluetooth is a specification developed by an international consortium for a radio system that allows electronic devices to wirelessly communicate with each other over short distances.

In yet another embodiment, the user could initiate a search for an available channel by pressing either the UP or DOWN end of SEARCH button 30 of sound reproduction system 20, causing sound reproduction system 20 to look for an available frequency, automatically switch to the available frequency, and to display the available frequency on display 24.

Although channel locator/selection controller 102, FM receiver 104, channel locator circuit 105, FM transmitter 106, channel selection circuit 107, and out-of-band transmitter 119 are shown as separate blocks in FIG. 2, they can be implemented in any desired manner. For example, they can be implemented as integrated blocks of circuitry, sharing common functional circuits.

Figure 3:
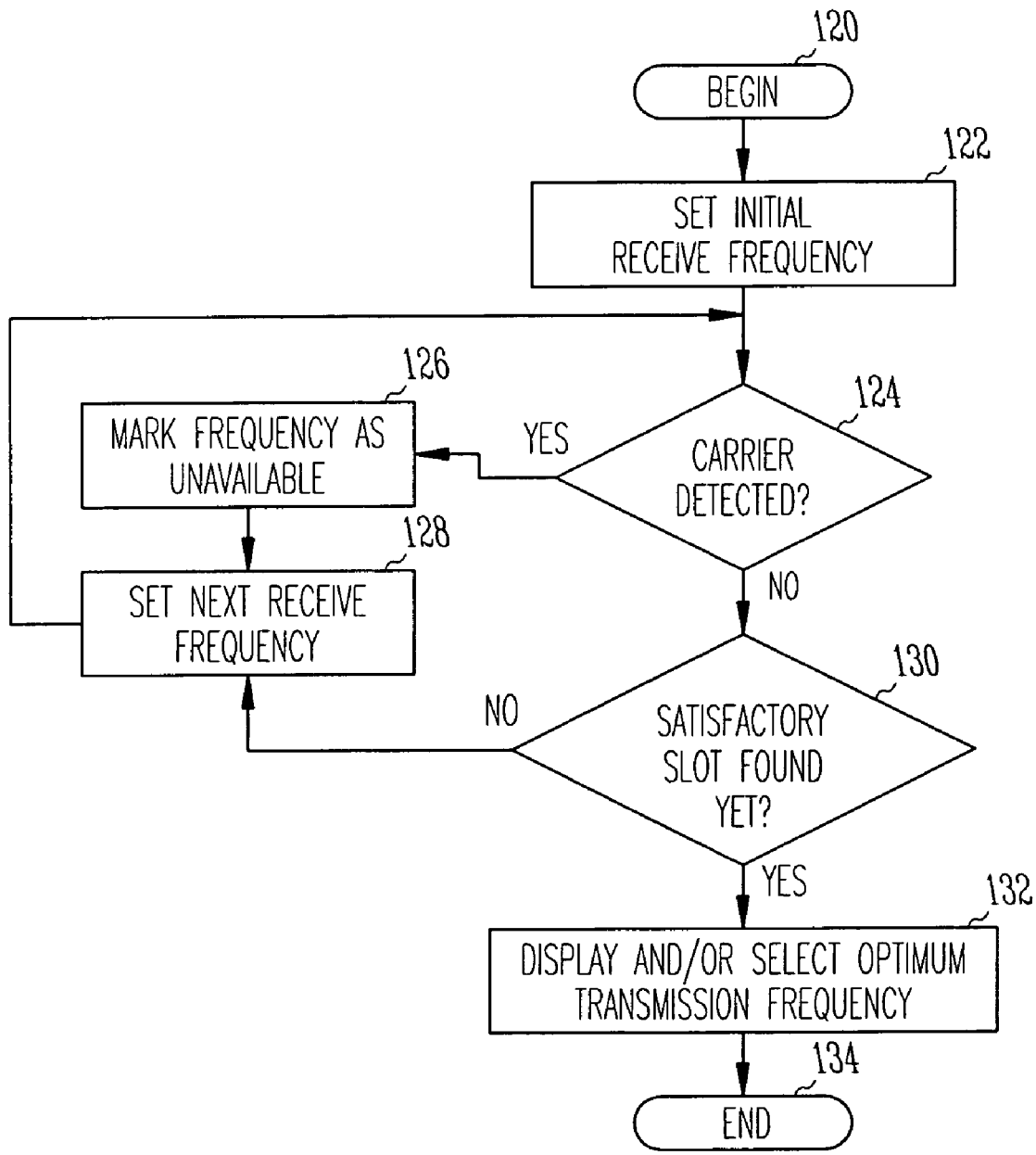
FIG. 3 is a flow diagram illustrating a method of finding and using available transmission frequencies, in accordance with one embodiment of the invention.

FIG. 3 is a flow diagram illustrating a method of finding and using available transmission frequencies, in accordance with one embodiment of the invention. This method can be used, for example, in the embodiment described in FIG. 2. The method begins at 120.

In 122, an initial receive frequency is set.

In 124, a determination is made whether a carrier is detected. If so, the method goes to 126; otherwise, it goes to 130.

In 126 this particular frequency is marked as unavailable, and the method goes to 128.

In 128, the next receive frequency is set, and the method returns to 124. Usually the next receive frequency is the next higher or next lower channel to which the FM receiver 104 (FIG. 2) can tune on the particular transmission band. For example, for an embodiment using FM transmission, in the U.S. the available commercial FM broadcast band ranges from 87.7 to 107.9 megahertz (MHz). Most FM receivers are capable of tuning the "odd" tenths of a megahertz, e.g. 87.7, 87.9, 88.1, 88.3, and so forth, up to 107.9.

In 130, a determination is made whether a satisfactory available frequency slot has been found yet. If so, the method proceeds to 132; otherwise, it returns to 128. As mentioned earlier, any suitable algorithm can be used to determine which available frequency could be selected as an optimum transmission frequency.

In 132, the optimum transmission frequency may be displayed. In one embodiment, the user views the optimum transmission frequency and then manually tunes an FM receiver in audio sink 112 (FIG. 2). In another embodiment, the optimum transmission frequency is automatically transmitted to the FM receiver in audio sink 112 without user involvement; however, if desired, the optimum transmission frequency can nonetheless be concurrently displayed to the user. The process ends at 134.

Figure 4:
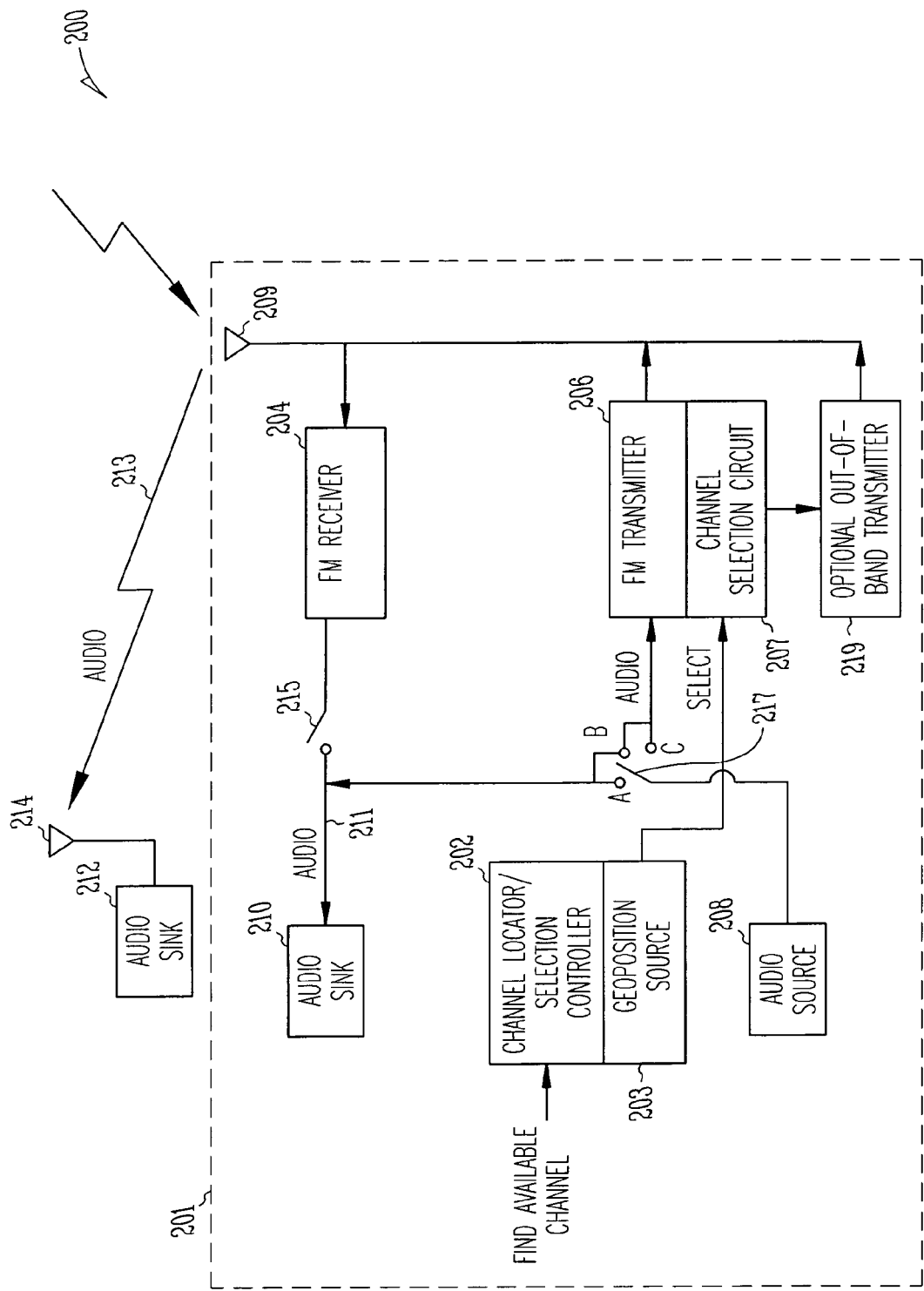
FIG. 4 is a block diagram of an RF network, including a portion of a sound generation device having circuitry to find and use available transmission frequencies, in accordance with another embodiment of the invention.

FIG. 4 is a block diagram of an RF network 200, including a portion of a sound generation device 201 having circuitry to find and use available transmission frequencies, in accordance with another embodiment of the invention. The RF network 200 illustrated in FIG. 4 can be substantially the same as that shown in FIG. 2, in that it comprises an audio source 208 to generate an audio signal to FM transmitter 206, assuming that switch 217 is appropriately set. FM transmitter 206 generates an audio signal via radio signal 213 from its antenna 209 to antenna 214 of audio sink 212, which is capable of reproducing the audio signal at a high level of quality. However, sound generation device 201 can optionally connect audio source 208 and/or FM receiver 204, by appropriately setting two-position switch 217 and three-position switch 215, to internal audio sink 210, which can be similar or identical to internal audio sink 110 (FIG. 2) described earlier.

Channel locator/selection controller 202, in one embodiment, controls the operation of sound generation device 201 in locating and selecting an available carrier frequency. Channel locator/selection controller 202 is implemented with a stored program digital computer in one embodiment; however, it can be implemented with any other suitable circuitry, including an application specific integrated circuit (ASIC).

In response to a command to find an available channel, channel locator/selection controller 202 is used in conjunction with a geoposition source 203 to identify an optimum available frequency. This process is explained in greater detail below regarding FIG. 5.

Still referring to FIG. 4, in one embodiment, a user of the sound generation device 201 determines whether the geoposition of the sound generation device 201 has changed. The user could readily determine this if he or she had just traveled from one geographical part of the country to another by airplane, or if he or she had traveled by surface transportation into a broadcast area of a carrier frequency that was producing audible interference with the audio output from audio sink 212.

If the geoposition has indeed changed, the user can input a new geoposition using, for example, a keyboard or a set of switches or buttons. In one embodiment, the geoposition and/or the transmit frequency of the sound generation device 201 can be permanently set by appropriate programming of a programmable read only memory device (PROM), assuming that sound generation device 201 will always remain within the same broadcast area. In other embodiments, the geoposition and/or the transmit frequency could be provided from any suitable type of memory device, such as a PROM, flash memory, a memory stick, and/or a hard disk, including a computer hard drive, a mini-disk, or a micro-disk.

In another embodiment, the geoposition is set, either manually or automatically without user involvement, through a suitable geoposition determining element, such as a cell phone or global position system (GPS) receiver.

The geoposition of any in-service cell phone is known to the cellular telecommunications infrastructure within which it is operated. In addition, the geoposition may be known to individual in-service cell phones. A cell phone user could obtain one or more available transmit frequencies in any of several different ways. For example, the cell phone user could dial a local cellular phone number to obtain a recording providing one or more available transmit frequencies.

Or the cell phone user could press a special function key on the cell phone to display one or more transmit frequencies, which the cell phone has retrieved from local memory residing, for example, within the cell phone or within the local cellular switching center. As another alternative, a cell phone user whose cell phone is endowed with Internet access could obtain one or more transmit frequencies from a table or database stored at an Internet site.

A GPS receiver is a well-known electronic device that is able to determine its precise location through the reception of signals from several GPS satellites orbiting the earth. A GPS receiver could be built into the sound generation device 201 to provide a precise geoposition on demand. Alternatively, the user of sound generation device 201 could utilize a separate GPS receiver to obtain his or her geoposition and then look up one or more available transmit frequencies, either manually in a table, codebook, publication, or the like, or automatically from a local memory, such as a read only memory (ROM), residing within the GPS receiver or the sound generation device 201.

After determining the geoposition of the sound generation device 201, channel locator/selection controller 202 can determine an optimum transmission frequency by using a table look-up function or database in which carrier frequencies are organized geographically.

As an alternative to channel locator/selection controller 202 determining an optimum transmission frequency based upon geoposition, the device user could manually look up an optimum transmission frequency in a table, codebook, publication, an Internet site, or other appropriate source, and manually enter it, using, for example, a keyboard or a set of switches or buttons. As another alternative, as mentioned earlier, the optimum transmission frequency could be permanently programmed into a PROM, assuming the sound generation device 201 will always remain in the same broadcast region.

When channel locator/selection controller 202 has generated or received (e.g. manually) an update of the optimum transmission frequency, it generates a "select" signal to channel selection circuit 207 of FM transmitter 206. The select signal conveys the optimum available frequency to FM transmitter 206, whereupon FM transmitter 206 either begins transmission over antenna 209 at that frequency (if it has been idle), or else FM transmitter 206 switches to that frequency (if it has previously been transmitting at a different frequency).

In another embodiment, to be discussed below, audio sink 212 can receive a channel selection signal from sound generation device 201, enabling it to automatically switch to the new transmission frequency of sound generation device 201. This can be carried out, for example, by transmitting a channel selection signal by an optional out-of-band transmitter 219. Out-of-band transmitter 219, which in one embodiment can transmit under the Bluetooth protocol, is coupled to channel selection circuit 207, and it transmits a channel selection signal, comprising the optimum available frequency, via antenna 209, through radio link 213, to antenna 214 of audio sink 212.

Although channel locator/selection controller 202, geoposition source 203, FM receiver 204, FM transmitter 206, channel selection circuit 207, and out-of-band transmitter 219 are shown as separate blocks in FIG. 4, they can be implemented in any desired manner. For example, they can be implemented as integrated blocks of circuitry, sharing common functional circuits.

Figure 5:
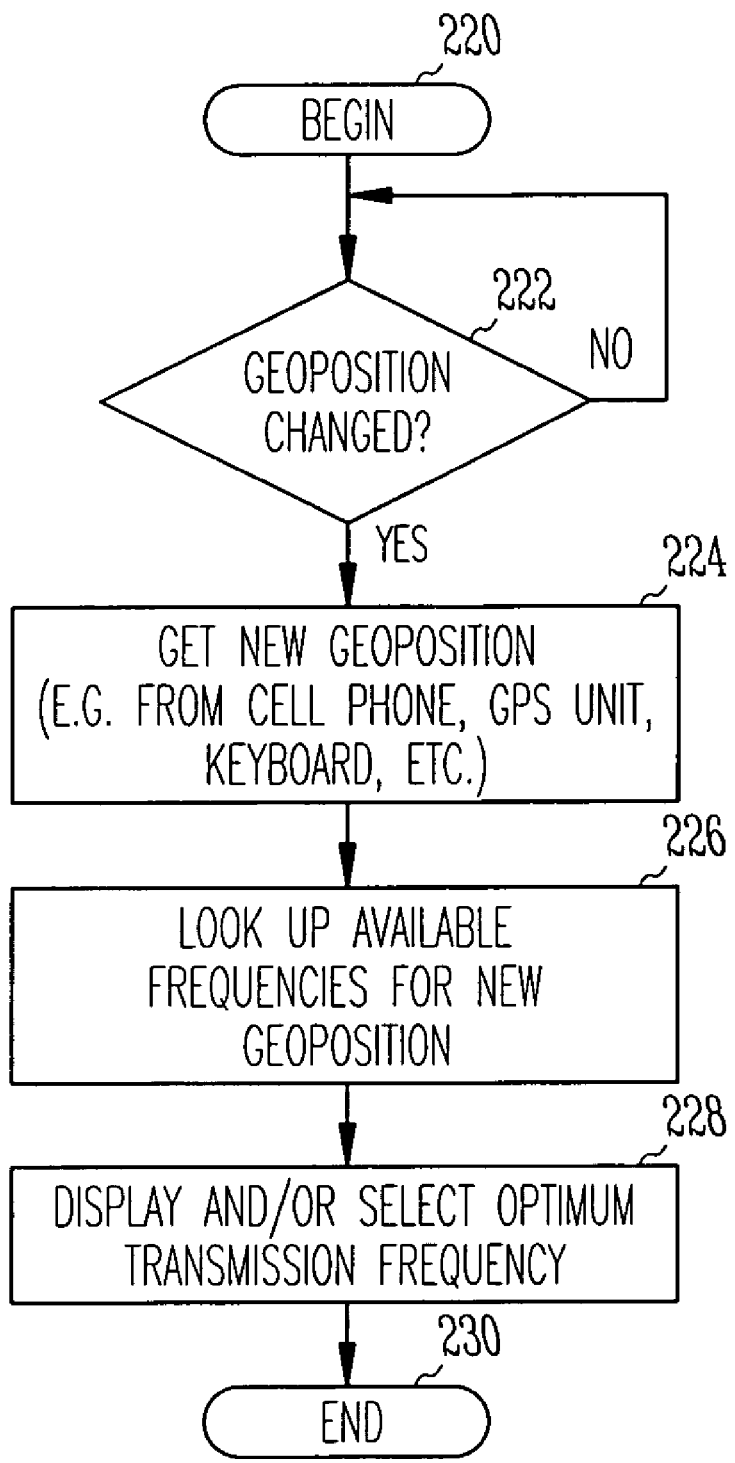
FIG. 5 is a flow diagram illustrating a method of finding and using available transmission frequencies, in accordance with another embodiment of the invention.

FIG. 5 is a flow diagram illustrating a method of finding and using available transmission frequencies, in accordance with another embodiment of the invention. This method can be used, for example, in the embodiment described in FIG. 4. Still referring to FIG. 5, the method begins at 220.

In 222, a determination is made, either manually or automatically, whether the geoposition of sound generation device 201 (FIG. 4) has changed. If so, the method proceeds to 224; otherwise, it loops back to re-perform 222 periodically and continually until the geoposition changes.

In 224, a new geoposition is obtained. This can be obtained, for example, from a cell phone, a GPS receiver unit, or from a geoposition programming device or data entry device, such as a keyboard, a set of switches, or any other suitable mechanism, as mentioned earlier.

In 226, available frequencies are looked up corresponding to the new geoposition. This can be done manually by the device user, or it can be performed automatically by appropriate circuitry within channel locator/selection controller 202 (FIG. 4).

Still referring to FIG. 5, in 228, the optimum transmission frequency may be displayed, if desired, particularly in any embodiment in which the device user is required to manually tune an RF receiver within audio sink 212 (FIG. 4). As an alternative, or concurrently with displaying the optimum transmission frequency, the optimum transmission frequency can be selected and appropriately conveyed to FM transmitter 206 (FIG. 4). In another embodiment, the optimum transmission frequency can also be transmitted as part of a channel selection signal from an out-of-band transmitter 219 (FIG. 4) to audio sink 212 (FIG. 4), as will be explained in greater detail regarding FIG. 7. The method ends at 230.

Figure 6:
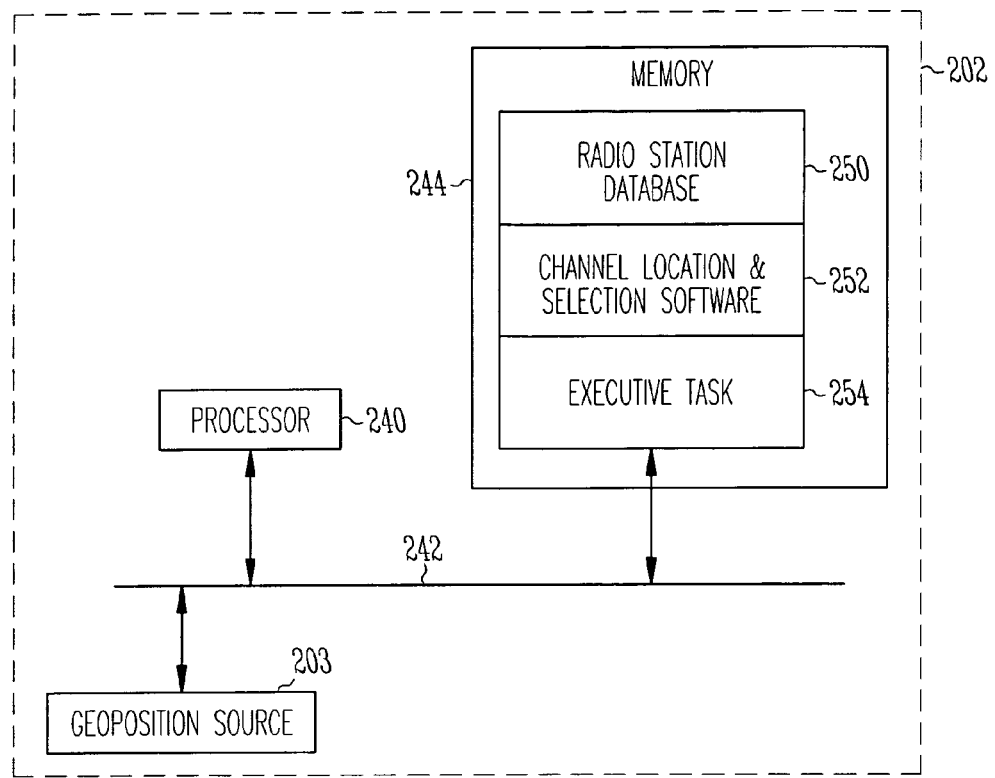
FIG. 6 is a block diagram of a channel locator/selection controller, in accordance with one embodiment of the invention.

FIG. 6 is a block diagram of a channel locator/selection controller 202, in accordance with one embodiment of the invention. Channel locator/selection controller 202 can comprise a processing element, such as processor 240. As used herein, "processor" means any type of computational circuit, such as but not limited to a microprocessor, a microcontroller, a complex instruction set computing (CISC) microprocessor, a reduced instruction set computing (RISC) microprocessor, a very long instruction word (VLIW) microprocessor, a graphics processor, a digital signal processor, or any other type of processor or processing circuit capable of performing the desired functions. Processor 240 is coupled to a system bus 242, which can be of any suitable type.

Also coupled to system bus 242 is geoposition source 203. As mentioned earlier, geoposition source 203 can comprise a cell phone, a GPS receiver, a keyboard, a set of switches, a PROM, a flash memory, a memory stick, and/or a hard disk, including a computer hard drive, a mini-disk, or a micro-disk, or any other suitable mechanism for entering a geoposition.

Also coupled to system bus 242 is a memory 244 of any suitable type. In one embodiment, memory 244 includes random access memory (RAM), read only memory (ROM), and programmable read only memory (PROM). The particular architectural implementation of memory 244 is not limited, and it can be designed in accordance with the system's requirements. Thus, some portions of memory 242 may reside within processor 240, such as cache memory and/or RAM. Also, memory 244 could employ a flash memory, a memory stick, and/or a hard disk, including a computer hard drive, a mini-disk, or a microdisk. It will be understood that for some embodiments, memory functions within memory 244 and within geoposition source 203 can be shared.

Various blocks of data and computer instructions are stored within memory 244, including an executive task 254, which is responsible to carry out a number of supervisory tasks. Also included within memory 244 are radio station database 250 and channel location and selection software 252. Radio station database 250 can be a look-up table or listing by geographical area, for example, of all FM radio stations licensed by the Federal Communications Commission for operation within the U.S., or licensed by a corresponding governmental body in any foreign country, or otherwise in operation in any country. The listing can take into account the broadcast range of individual FM stations. It can also account for the influence of transmission-limiting factors, such as mountain ranges or other topological features. One of ordinary skill in the art is capable of generating a suitable lookup table or database, e.g. in the form of radio station database 250, to implement a channel location and selection capability within channel locator/selection controller 202.

Channel location and selection software 252 can include suitable machine-readable instructions in a machine-readable medium for controlling the operation of processor 240 to carry out the various functions of certain elements of the inventive subject matter, and the operations of the methods, as described herein. One of ordinary skill in the art is capable of writing suitable instructions, e.g. in the form of channel location and selection software 252, to implement a channel location and selection capability within channel locator/selection controller 202.

Figure 7:
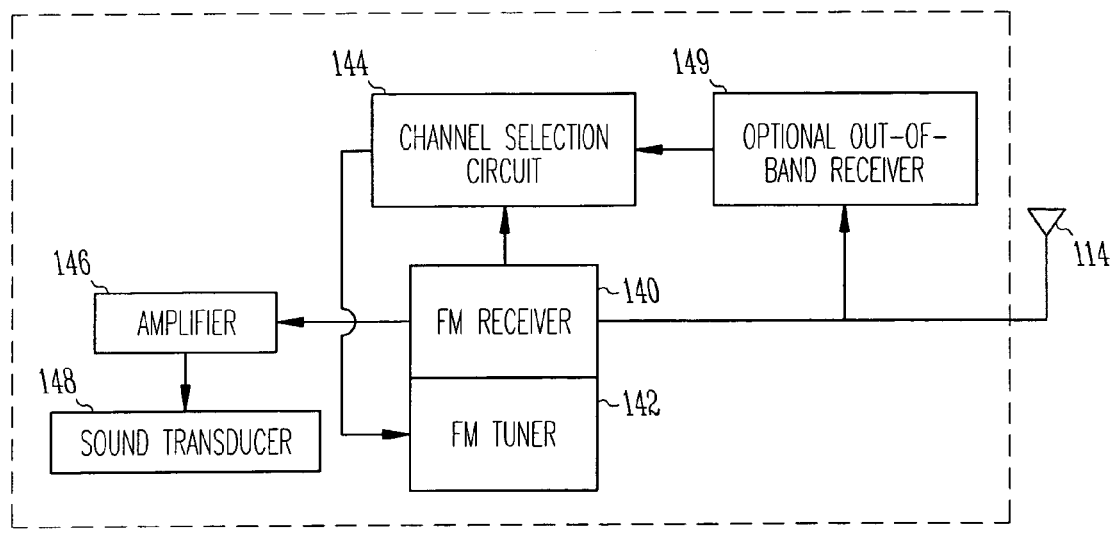
FIG. 7 is a block diagram of a sound reproduction device, in accordance with one embodiment of the invention.

FIG. 7 is a block diagram of a sound reproduction device or audio sink 112, in accordance with one embodiment of the invention. Audio sink 112 comprises an antenna 114 to receive audio signals over an available transmission frequency from an FM receiver of a sound generation device, such as sound generation device 10 (FIG. 2), sound generation device 101 (FIG. 2), or sound generation device 201 (FIG. 4).

In another embodiment, to be described below, in which audio sink 112 can receive a channel selection signal on an out-of-band frequency, audio sink 112 can also include an out-of-band receiver 149 coupled to antenna 114 and to channel selection circuit 144.

Still referring to FIG. 7, audio sink 112 further comprises FM receiver 140 and an associated FM tuner 142. FM tuner 142 tunes FM receiver 140 to a specific carrier frequency. In turn, FM receiver 140 demodulates audio content from the carrier frequency and sends the audio content to high fidelity amplifier 146, which amplifies the audio content and sends it to sound transducer 148.

Audio sink 112 can also comprise channel selection circuit 144. In response to receipt of a channel selection signal over antenna 114 from channel selection circuit 107 and out-of-band transmitter 119 (FIG. 2), out-of-band receiver 149 can generate a channel selection signal to channel selection circuit 144. Channel selection circuit 144, in turn, generates a channel selection signal to FM tuner 142, to cause FM tuner 142 to tune FM receiver 140 to the currently available transmission frequency.

The channel selection signal can be sent in any appropriate transmission medium. In one embodiment, the channel selection signal is sent as an RF transmission outside the FM broadcast band, e.g. at a Bluetooth frequency.

In other embodiment, the channel selection signal could be sent to audio sink 112 over a wireline connection between sound generation device 101 (FIG. 2) and audio sink 112. The wireline connection could be through a dedicated cable or through a communications network that employs an existing in-building telephone, power line, or other type of cabled network.

In yet another embodiment, the channel selection signal could be sent to audio sink 112 over a light-beam transmission, such as an infra-red beam from a suitable beam modulation element (not shown) in the sound generation device to a suitable detector (not shown) on audio sink 112.

Figure 8:
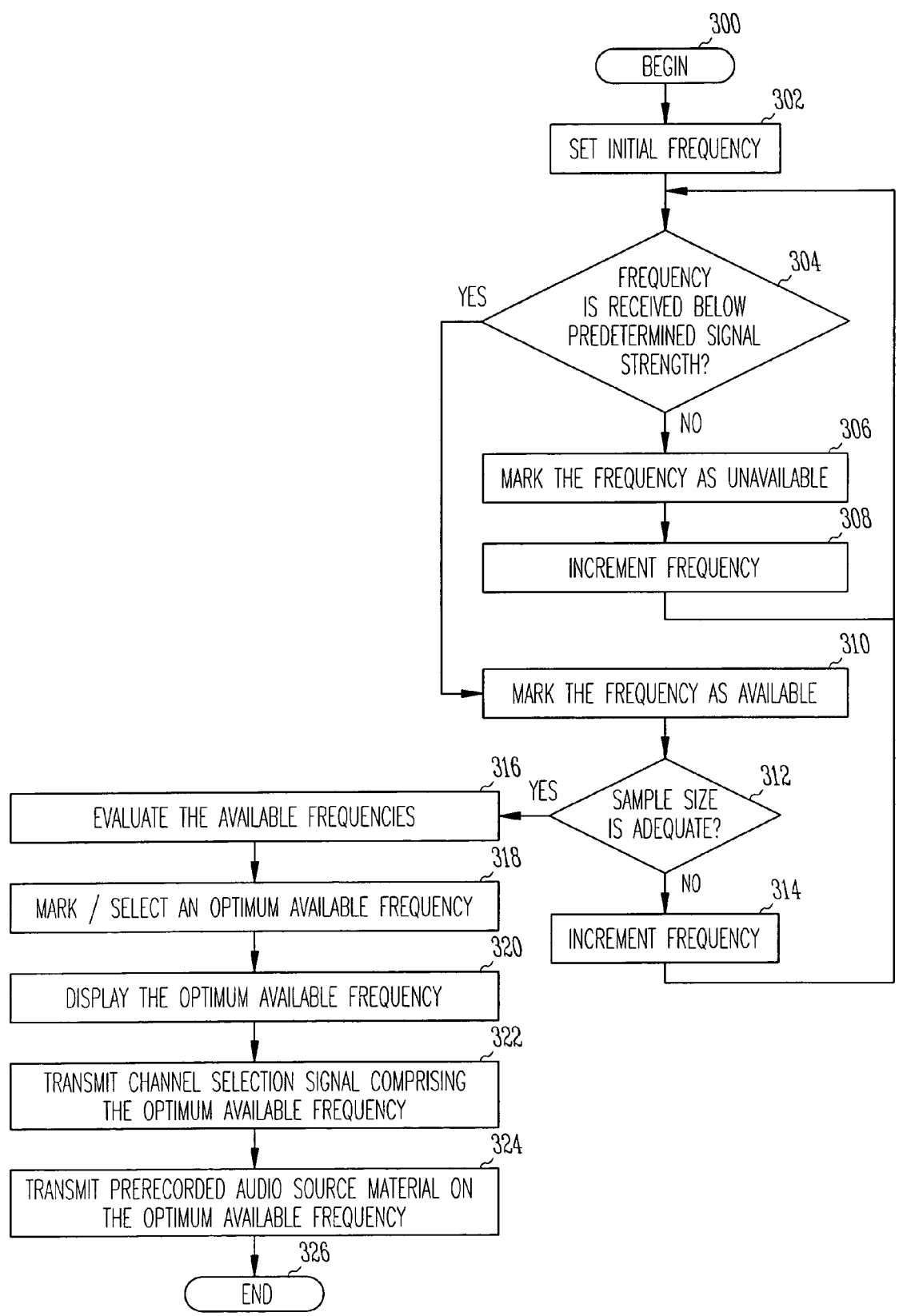
FIG. 8 is a flow diagram illustrating a method of finding and using available transmission frequencies, in accordance with one embodiment of the invention.

FIG. 8 is a flow diagram illustrating a method of finding and using available transmission frequencies, in accordance with one embodiment of the invention, e.g. the embodiment shown in FIG. 2. The method begins at 300.

In 302, an initial frequency or channel within the broadcast band of interest is set or selected. For example, a frequency at one end of the broadcast band could be selected.

In 304, a determination is made whether the signal strength of the current frequency is below a predetermined value. If so, the method goes to 310; otherwise, it goes to 306.

In 306, the frequency is marked as unavailable.

In 308, the frequency is incremented to the next higher or lower frequency on the band of interest, and the method loops back to 304.

In 310, the frequency is marked as available.

In 312, a determination is made whether the sample size is adequate, based on any desired criteria (an adequate sample size could be as low as one sample, or it could be any desired number higher than one). If so, the method goes to 316; otherwise, it goes to 314.

In 314, the frequency is incremented, and the method loops back to 304.

In 316, the available frequencies are evaluated according to any suitable algorithm, such as one of the algorithms mentioned earlier regarding FIG. 2.

In 318, an optimum available frequency is marked.

In 320, the optimum available frequency is displayed, if desired, depending upon the type of sound generation device 10 (FIG. 1) being used. For example, in one embodiment of a sound generation device 10 the user could perform one, some, or all of the operations in this flow diagram through and including operation 322. In another embodiment, all of the operations in this flow diagram can be performed by sound generation device 10 without user involvement.

In 322, the channel selection signal is optionally transmitted via a suitable transmission medium, such as one of those mentioned above regarding FIG. 7, to the channel selection circuit 144 of audio sink 112 (FIG. 7). The channel selection signal causes FM tuner 142 of audio sink 112 to tune to the optimum available frequency. In another embodiment, the device user could manually tune the RF receiver of the sound reproduction device to the optimum available frequency.

In 324, audio content, such as but not limited to prerecorded audio source material, is transmitted on the optimum available frequency from the sound generation device to the sound reproduction device (e.g. from sound generation device 10 to sound reproduction device 20, FIG. 1). The method ends at 326.

Figure 9:
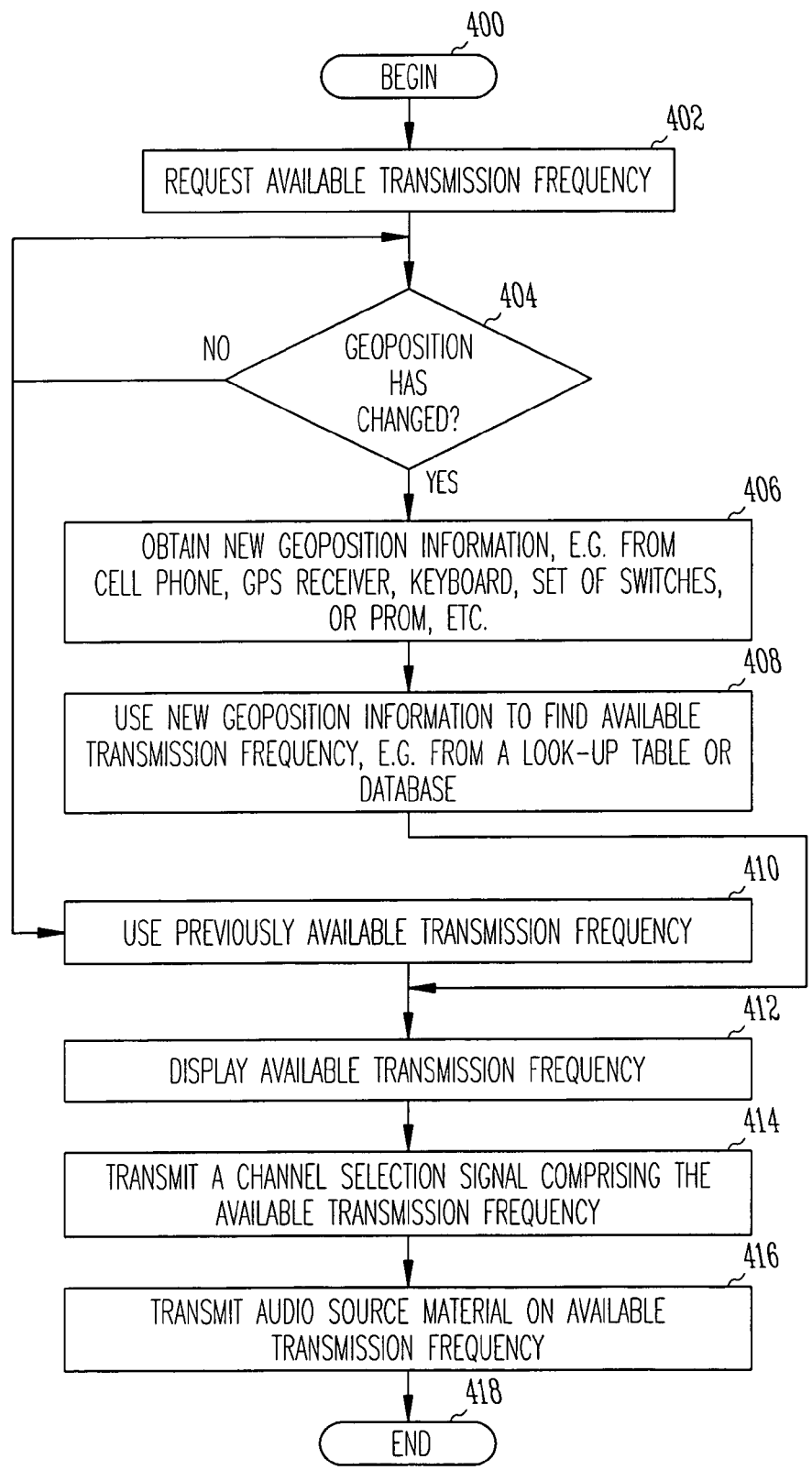
FIG. 9 is a flow diagram illustrating a method of finding and using available transmission frequencies, in accordance with another embodiment of the invention.

FIG. 9 is a flow diagram illustrating a method of finding and using available transmission frequencies, in accordance with another embodiment of the invention, e.g. the embodiment shown in FIG. 4. The method begins at 400.

In 402, the method can be initiated, for example, with a request by a sound generation device (e.g. sound generation device 10, FIG. 1) for an available transmission frequency.

In 404, a determination is made whether the geoposition of the sound generation device has changed. If so, the method goes to 406; otherwise, it goes to 410 although it also loops back to 404 to periodically check for any change in geoposition.

In 406, new geoposition information is obtained, e.g. from a cellular phone or GPS receiver (automatically or manually). Alternatively, new geoposition information is obtained manually from the user through a keyboard, one or more switches, a PROM, or the like. For example, the user could enter a zip code or postal code. Alternatively, the user could scroll through a list of city names and select the city where he or she is currently located.

In 408, the new geoposition information is used to find an available transmission frequency. As described earlier, this can be obtained from a look-up table or database of available carrier frequencies arranged by geoposition.

In 410, the previously available transmission frequency is used, since there has been no change in the geoposition of the sound generation device.

In 412, the available transmission frequency can be displayed. This can be optional in an embodiment wherein the available transmission frequency is automatically used to adjust the tuner of the RF receiver in the sound reproduction device.

In 414, a channel selection signal, comprising sufficient information to identify the available transmission frequency, can be transmitted, e.g., for the embodiment just described for 412.

In 416, audio source material is transmitted on the available transmission frequency from the sound generation device to the sound reproduction device (e.g. from sound generation device 10 to sound reproduction device 20, FIG. 1). The method ends at 418.

Figure 10:
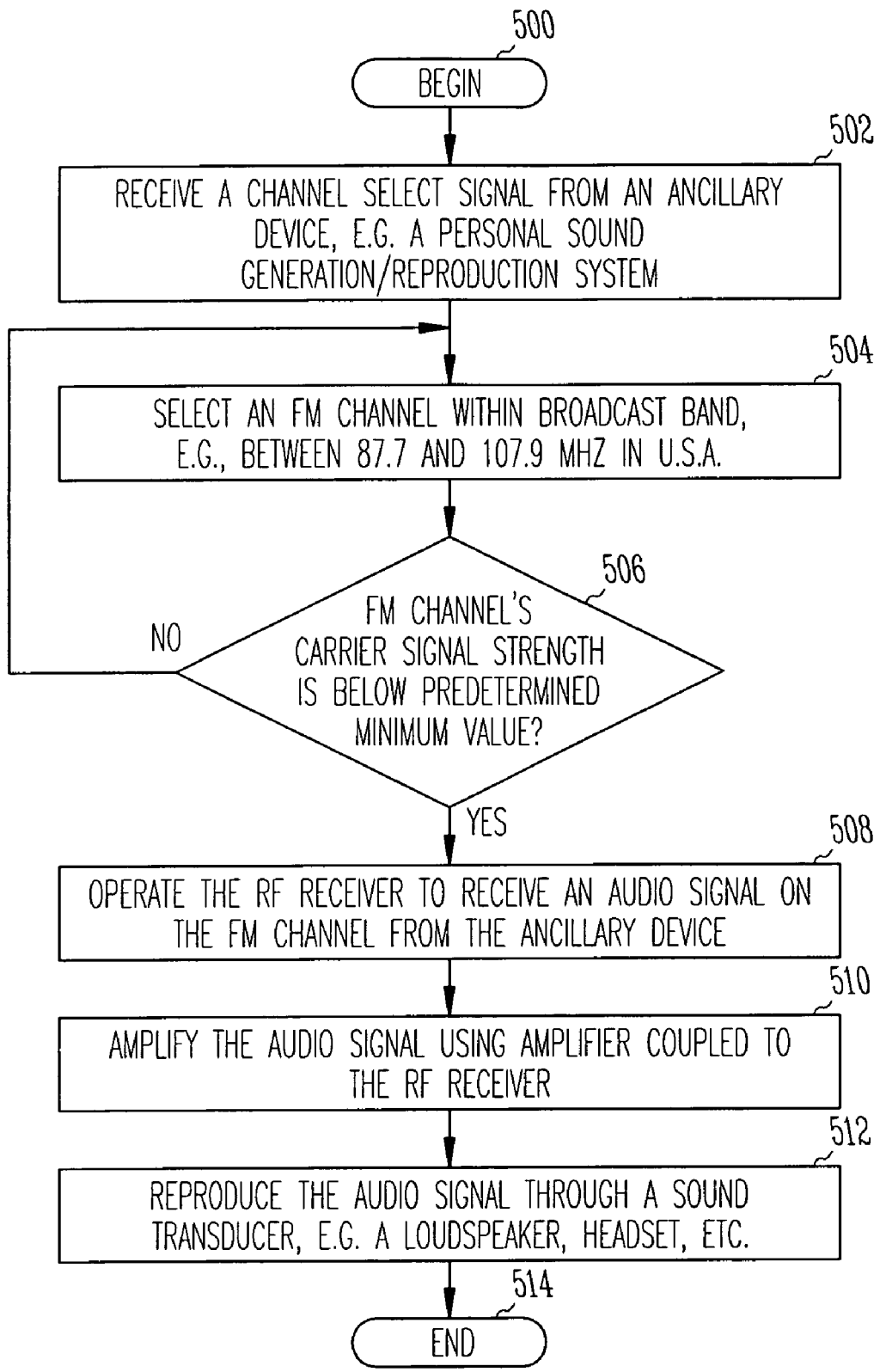
FIG. 10 is a flow diagram illustrating a method of operating a sound reproduction system, in accordance with one embodiment of the invention.

FIG. 10 is a flow diagram illustrating a method of operating a sound reproduction system, in accordance with one embodiment of the invention, e.g. the embodiment of an audio sink shown in FIG. 7. The method begins at 500.

In 502, a channel selection signal is received by the audio sink from an ancillary device, e.g. a sound generation device such as a personal sound generation/reproduction system like sound generation device 10 (FIG. 1).

In 504, an FM channel is selected within the broadcast band of interest. For example, in the U.S., this would be between 87.7 MHz and 107.9 MHz. However, the inventive subject matter is not to be construed as limited to any particular modulation type or to any particular frequency band.

In 506, a determination is made whether the carrier signal strength of the FM channel is below a predetermined minimum value. If so, this particular FM channel is selected (manually or automatically) as an available transmission frequency, and the method goes to 508; otherwise, the method loops back to 504, and a different FM channel is selected from the FM broadcast band, e.g. by incrementing or decrementing to the next closest frequency slot in the FM band. If desired, as part of 506, additional FM channels can be evaluated as potentially available transmission frequencies, and an optimum transmission frequency can be selected, as described elsewhere herein.

In 508, the RF receiver of the audio sink is operated to receive an audio signal broadcast on the FM channel from the ancillary device. The audio signal can comprise any type of audio source material, as described elsewhere herein.

In 510, the audio signal is amplified by the audio sink, using a high fidelity amplifier coupled to the RF receiver of the audio sink.

In 512, the audio signal is reproduced through any appropriate sound transducer coupled to the amplifier, e.g., a loudspeaker, headset, or the like. The method ends at 514.

It should be understood that the operations shown in the flow diagrams of FIGS. 3, 5, and 8-10 are merely representative and not exclusive, and that many other different alternative operations could be implemented using the concepts taught by the inventive subject matter.

The operations described above with respect to the methods illustrated in FIGS. 3, 5, and 8-10 can be performed in a different order from those described herein. Also, it will be understood that although the methods are described as having an "end", they typically are continuously performed.

It will be understood that some or all of the operations illustrated in FIGS. 3, 5, and 8-10 could be carried out by suitable instructions in one or more computer programs that are stored in a suitable memory (such as memory 244, FIG. 6) and executed by a suitable processor (such as processor 240, FIG. 6). One of ordinary skill in the art is capable of writing suitable instructions to implement the channel location and selection functions as described herein.

CONCLUSION

The inventive subject matter provides sound reproduction for a small portable, personal entertainment system or sound generation device capable of generating and/or reproducing music or sound, such as an MP3 player, CD player, mini-disk player, micro-disk player, DVD player, cassette tape player, radio, cellular phone, handheld computer, portable computer, television, video player, personal digital assistant, electronic musical instrument, electronic toy, wireless microphone, or the like. Various embodiments have been illustrated and described herein.

According to one embodiment, a low-power FM transmitter forms part of the personal entertainment system or portable sound generation device. In one embodiment, the music or sound generated by the portable sound generation device is reproduced through a sound reproduction device that forms part of an entertainment system such as, but not limited to, a vehicular stereo, home stereo, boom box, or RF headset. The inventive subject matter offers an inexpensive, straight-forward solution to reproducing audio source material residing on or emanating from a portable sound generation device, thereby significantly increasing the versatility and commercial value of such devices.

Other embodiments will be readily apparent to those of ordinary skill in the art. The elements, architecture, and sequence of operations can all be varied to suit particular configurations of audio sources and particular sound reproduction requirements.

The various elements depicted in the drawings are merely representational and are not drawn to scale. Certain proportions thereof may be exaggerated, while others may be minimized. The drawings are intended to illustrate various implementations of the inventive subject matter, which can be understood and appropriately carried out by those of ordinary skill in the art.

Although specific embodiments have been illustrated and described herein, it will be appreciated by those of ordinary skill in the art that any arrangement or process that is calculated to achieve the same purpose may be substituted for the specific embodiment shown. This application is intended to cover any adaptations or variations of the inventive subject matter. Therefore, it is manifestly intended that embodiments of this invention be limited only by the claims and the equivalents thereof.

What is claimed is:

1. A sound generation device comprising:
an audio source to generate an audio signal;
a frequency modulation (FM) radio frequency (RF) transmitter, coupled to the audio source, to transmit an FM carrier signal modulated with the audio signal, the FM carrier signal having a specific carrier frequency within the range of 87.7 to 107.9 megahertz that does not interfere with transmission frequencies in a commercial FM broadcast band of 87.7 to 107.9 megahertz in a geographical region in which the sound generation device is currently located;
a channel locator controller to identify an available non-interfering carrier frequency, wherein the channel locator controller includes
an RF receiver, coupled to the RF transmitter, to receive FM signals having different carrier frequencies; and
a channel locator circuit, coupled to the RF receiver, to identify two or more bands of FM carrier frequencies below a minimum signal strength;
wherein the channel locator controller is configured to identify an available non-interfering carrier frequency from an evaluation of the two or more bands of FM carrier frequencies; and
an out-of-band transmitter to transmit a channel selection signal comprising the available non-interfering carrier frequency.

2. The sound generation device recited in claim 1, wherein the sound generation device further comprises:
a channel selection circuit, coupled to the RF transmitter, to select the available carrier frequency on which to transmit the FM carrier signal.

3. The sound generation device recited in claim 1, wherein the sound generation device comprises one of an MP3 (Motion Picture Experts Group, Audio Layer 3) player, a compact disk player, a mini-disk player, a micro-disk player, a digital music player, a digital video disk player, a cassette tape player, a radio, a cellular phone, a handheld computer, a portable computer, a television, a video player, a personal digital assistant, an electronic musical instrument, an electronic toy, and a wireless microphone.

4. The sound generation device recited in claim 1, wherein the channel locator controller identifies the available non-interfering carrier frequency by selecting a center frequency of a first band of FM carrier frequencies having at least a predetermined frequency width.

5. The sound generation device recited in claim 1, wherein the channel locator controller identifies the available non-interfering carrier frequency by selecting a center frequency of a widest identified band.

6. A portable electronic device comprising:
a geoposition source;
an audio source coupled with the geoposition source to generate an audio signal;
a frequency modulation (FM) radio frequency (RF) transmitter, coupled to the audio source, to transmit an FM carrier signal modulated with the audio signal; and
a channel locator controller to identify an available non-interfering carrier frequency for the FM carrier signal having a specific carrier frequency within the range of 87.7 to 107.9 megahertz that does not interfere with transmission frequencies in a commercial FM broadcast band of 87.7 to 107.9 megahertz in a geographical region in which the portable electronic device is currently located;
wherein the channel locator controller includes a stored program digital computer, the computer to store a database of two or more available non-interfering carrier frequencies arranged by geoposition;
wherein the geoposition source is coupled to the stored program digital computer to provide a geoposition to the stored program digital computer;
wherein the channel locator controller is configured to identify a selected non-interfering carrier frequency from two or more available non-interfering frequencies stored in the database based on an evaluation of the two or more available non-interfering frequencies; and
an out-of-band transmitter to transmit a channel selection signal comprising the selected non-interfering carrier frequency.

7. The device recited in claim 6, wherein the audio source comprises prerecorded audio source material.

8. The device recited in claim 6, wherein the audio source comprises a digital music player.

* * * * *